United States Patent
Lokrantz et al.

(10) Patent No.: US 9,831,865 B2
(45) Date of Patent: Nov. 28, 2017

(54) RC-IGBT SWITCHING PULSE CONTROL

(71) Applicant: ABB Schweiz AG, Baden (CH)

(72) Inventors: Annika Lokrantz, Ludvika (SE); Kristoffer Nilsson, Ludvika (SE); Ying Jiang-Häfner, Ludvika (SE); Christer Sjöberg, Ludvika (SE); Lars Döfnäs, Ludvika (SE); Wim Van-Der-Merwe, Baden-Dättwil (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 14/774,026

(22) PCT Filed: Apr. 5, 2013

(86) PCT No.: PCT/EP2013/057218
§ 371 (c)(1),
(2) Date: Sep. 9, 2015

(87) PCT Pub. No.: WO2014/161600
PCT Pub. Date: Oct. 9, 2014

(65) Prior Publication Data
US 2016/0020764 A1    Jan. 21, 2016

(51) Int. Cl.
*H02M 1/08* (2006.01)
*H03K 17/567* (2006.01)
(Continued)

(52) U.S. Cl.
CPC .......... *H03K 17/567* (2013.01); *H02M 7/537* (2013.01); *H03K 17/18* (2013.01);
(Continued)

(58) Field of Classification Search
CPC .......... H02M 2001/0054; H02M 7/53; H02M 7/537; H02M 7/538; H02M 7/53803; H03K 17/567
See application file for complete search history.

(56) References Cited

U.S. PATENT DOCUMENTS

2009/0057832 A1    3/2009  Kouno
2012/0092912 A1    4/2012  Eckel
(Continued)

FOREIGN PATENT DOCUMENTS

DE    10 2009 001 029 A1    8/2010
DE    10 2011 003 938 A1    8/2012
(Continued)

OTHER PUBLICATIONS

Rahimo et al., "A High Current 3300V Module Employing Reverse Conducting IGBTs Setting a New Benchmark in Output Power Capability", Proceedings of the 20th International Symposium on Power Semiconductor Devices & IC's, May 18-22, 2008, Orlando, FL, pp. 68-71.

*Primary Examiner* — Harry Behm
(74) *Attorney, Agent, or Firm* — Birch, Stewart, Kolasch & Birch, LLP

(57) ABSTRACT

A method for controlling a first and a second reverse-conducting insulated gate bipolar transistor (RC-IGBT), electrically connected in series, is disclosed. A collector of the first RC-IGBT is electrically connected to a positive pole of a direct current voltage source, and an emitter of the second RC-IGBT is electrically connected to a negative pole of the DC voltage source. Further, an emitter of the first RC-IGBT is electrically connected to a collector of the second RC-IGBT to form an alternating current terminal. A gate voltage is applied to respective gates of the first and second RC-IGBTs, wherein the gate voltage is controlled based on a magnitude and a direction of an output current on the AC terminal and on a command signal alternating between a first and a second value.

18 Claims, 4 Drawing Sheets

(51) Int. Cl.
*H03K 17/18* (2006.01)
*H02M 7/537* (2006.01)
*H02M 1/00* (2006.01)
*H03K 17/687* (2006.01)

(52) U.S. Cl.
CPC ............ *H02M 2001/0054* (2013.01); *H02M 2001/0058* (2013.01); *H03K 17/6871* (2013.01); *H03K 2217/0027* (2013.01); *H03K 2217/0036* (2013.01)

(56) References Cited

U.S. PATENT DOCUMENTS

| | | | |
|---|---|---|---|
| 2013/0049843 A1* | 2/2013 | Jorge | H03K 17/168 327/438 |
| 2013/0082741 A1 | 4/2013 | Domes | |
| 2013/0207712 A1* | 8/2013 | Suzuki | H03K 17/165 327/379 |
| 2013/0321062 A1 | 12/2013 | Eckel | |

FOREIGN PATENT DOCUMENTS

| | | |
|---|---|---|
| EP | 1 455 440 A2 | 9/2004 |
| EP | 2 446 536 A2 | 5/2012 |
| JP | 2009-268336 A | 11/2009 |
| JP | 2012-143115 A | 7/2012 |
| WO | WO 2010/149430 A2 | 12/2010 |
| WO | WO 2010/149431 A2 | 12/2010 |
| WO | WO 2010/149432 A2 | 12/2010 |
| WO | WO 2012/107258 A2 | 8/2012 |

* cited by examiner

RC-IGBT SWITCHING PULSE CONTROL

FIELD OF THE INVENTION

The invention disclosed herein relates to power semiconductor devices. More precisely, it relates to a method of controlling reverse-conducting insulated gate bipolar transistors (RC-IGBTs), in particular bi-mode insulated gate transistors (BIGTs), as well as a controller for controlling such RC-IGBTs.

BACKGROUND OF THE INVENTION

IGBTs are widely used in high-power switching equipment, such as high-voltage DC (HVDC) equipment, including voltage source converters. In such applications, IGBTs are typically combined with a diode arranged in parallel and conducting in the reverse transistor direction ("free wheel diode").

RC-IGBTs are chips in which a transistor is combined with a diode conducting in the reverse transistor direction. Numerous chip designs have been proposed and used within this concept, which has also been further developed into the bi-mode insulated gate transistor (BIGT). As used herein, the term RC-IGBT covers both conventional RC-IGBTs and BIGTs. The RC-IGBT can be operated both in an IGBT mode (positive collector-emitter current), also referred to as transistor mode or forward mode, and in a diode mode (negative collector-emitter current) also referred to as reverse mode. However, the anode efficiency in the diode mode is dependent on the gate voltage. When the gate is turned off, the anode efficiency in diode mode is high while the anode efficiency is reduced when the gate is turned on. A particular advantage of BIGTs over other RC-IGBT designs is their soft turn-off behaviour in both IGBT and diode mode. It also appears possible to reduce the reverse recovery losses in BIGTs further than in earlier RC-IGBT technology.

Aspects of the gate-emitter voltage control in RC-IGBTs are discussed in an article by Rahimo et al. entitled "A high current 3300 V module employing reverse conducting IGBTs setting a new benchmark in output power capability", Proceedings of the 20$^{th}$ International Symposium on Power Semiconductor Devices & ICs (18-22 May 2008).

SUMMARY OF THE INVENTION

It is an object of the present invention to control the gate-emitter voltage of a pair of RC-IGBTs in such manner that the overall energy efficiency in a switching cycle is improved. The pair of RC-IGBTs may e.g. be arranged in a full bridge (such as an H-bridge) or a half bridge in a voltage source converter.

Accordingly, the invention provides a control method and a controller having the features set forth in the independent claims. Advantageous embodiments of the invention are defined by the dependent claims.

Hence, according to a first aspect a method of controlling a first and a second reverse-conducting insulated gate bipolar transistor (RC-IGBT), electrically connected in series, is provided. A collector of the first RC-IGBT is electrically connected to a positive pole of a direct current (DC) voltage source and an emitter of the second RC-IGBT is electrically connected to a negative pole of the DC voltage source. Further, an emitter of the first RC-IGBT is electrically connected to a collector of the second RC-IGBT to form an alternating current (AC) terminal. The method comprises applying a gate voltage to respective gates of the first and second RC-IGBTs. The gate voltage is controlled based on a magnitude and a direction of an output current on the AC terminal and on a command signal (Cmd) indicating targeted turn-on and turn-off instants for the respective RC-IGBTs.

According to a second aspect, a controller for controlling a first and a second RC-IGBT is provided. The first and second RC-IGBTs are electrically connected in series and arranged such that a collector of the first RC-IGBT is electrically connected to a positive pole of a DC voltage source and an emitter of the second RC-IGBT is electrically connected to a negative pole of the DC voltage source. An emitter of the first RC-IGBT is electrically connected to a collector of the second RC-IGBT to form an AC terminal, and the controller is connected to a directive current meter arranged to measure an output current flowing from the AC terminal. The controller comprises an input circuit adapted to receive a command signal indicating targeted turn-on and turn-off instants for the respective RC-IGBTs. The controller also comprises a processor adapted to receive information from a current meter on a magnitude and direction of a measured output current on the AC terminal. The processor is further adapted to determine, based on the received command signal and the received information on the magnitude and direction of the measured output current, a gate voltage for application to respective gates of the first and second RC-IGBTs. The controller further comprises an output circuit connected to respective gates of the first and second RC-IGBT, wherein the output circuit is adapted to apply a determined gate voltage to the respective gates of the first and second RC-IGBTs.

According to a third aspect, a voltage source converter for converting between AC and DC current is provided. The voltage source converter comprises an arrangement of connected RC-IGBTs comprising at least a first and a second RC-IGBT electrically connected in series and arranged such that a collector of the first RC-IGBT is electrically connected to a positive pole of a DC voltage source and an emitter of the second RC-IGBT is electrically connected to a negative pole of the DC voltage source. An emitter of the first RC-IGBT is electrically connected to a collector of the second RC-IGBT to form an AC terminal The voltage source converter further comprises a controller in accordance with the second aspect of the present invention.

According to a fourth aspect, a computer program product is provided. The computer program product comprises a data carrier with instructions for causing a programmable processing unit, connected to a first and a second RC-IGBT, to perform the method according to the first aspect of the invention.

Embodiments of the present invention are advantageous in that a mode-dependent switching control is enabled. Controlling the switching of the RC-IGBTs based on the direction of the output current at the AC terminal, in addition to the command signal, allows for a reduction of the gate voltage applied to the RC-IGBTs when operated in diode mode in order to reduce the resistance, and hence conduction losses, of the RC-IGBT. Furthermore, applying a high-level gate voltage when the RC-IGBT in diode mode is about to be turned off may minimize the stored charge and reduce reverse recovery losses. By also controlling the switching based on the magnitude of the output current, the risk for mistaking the direction of output currents with low magnitude may be reduced. The invention thereby provides the possibility of reducing conduction and switching losses in the RC-IGBTs in a safe and reliable way.

Omitting at least some switching of one of the RC-IGBTs in response to the output current having a large magnitude, i.e. above a selected current magnitude threshold, as in certain of the embodiments of this disclosure advantageously allows for a reduction of switching losses.

It will be appreciated that the DC voltage source referred to above may be a high-voltage direct current (HVDC) electric power transmission system, a photovoltaic element, or a storage element. Furthermore, the first and the second RC-IGBTs may be included in a cell configuration such as a half-bridge configuration, or included in a full-bridge configuration, and electrically connected to a storage element. It will also be appreciated that if the first and the second RC-IGBTs are included in a cell of a branch of cascade connected cells, a measurement of the output current on the AC terminal may be obtained by a directive current meter measuring the current through the branch, anywhere in the branch. The current meter may supply one or several controllers with information on the output current. Thus e.g. in an HVDC converter comprising a number of branches of multiple cascade connected cells connected between an AC terminal of the converter and a DC terminal, it is possible to measure the branch current of each branch and provide this as information on the output current to a plurality of controllers providing gate control to a plurality of cells according to different embodiments of this disclosure. The branch current may be measured at a location in the arm that is deemed appropriate such as near an arm reactor. Consequently the branch current need not be measured locally near the RC-IGBTs.

The first and second RC-IGBTs may be a pair of BIGTs.

It will also be appreciated that the command signal may be generated by a control unit, which also may be adapted to determine the magnitude and the direction of the output current from the first and second RC-IGBTs based on received information from the directive current meter, and to deliver the direction and magnitude of the output current to the controller.

As mentioned above, according to one aspect of the invention computer-readable instructions for controlling a programmable processing unit is provided. Such instructions may be distributed in the form of a computer-program product comprising a computer-readable medium storing the instructions. In particular, the instructions may be loaded in a FPGA or a microcontroller in a gate unit responsible for supplying high- and low-level gate voltage to one or several RC-IGBTs.

Further objectives, features and advantages of the present invention will be apparent when studying the following detailed disclosure, the drawings and the appended claims. Those skilled in the art realize that different features of the present invention, even if recited in different claims, can be combined in embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which.

All the figures are schematic and generally only show parts which are necessary in order to elucidate the invention, whereas other parts may be omitted or merely suggested.

DETAILED DESCRIPTION OF EMBODIMENTS

Figure 1:
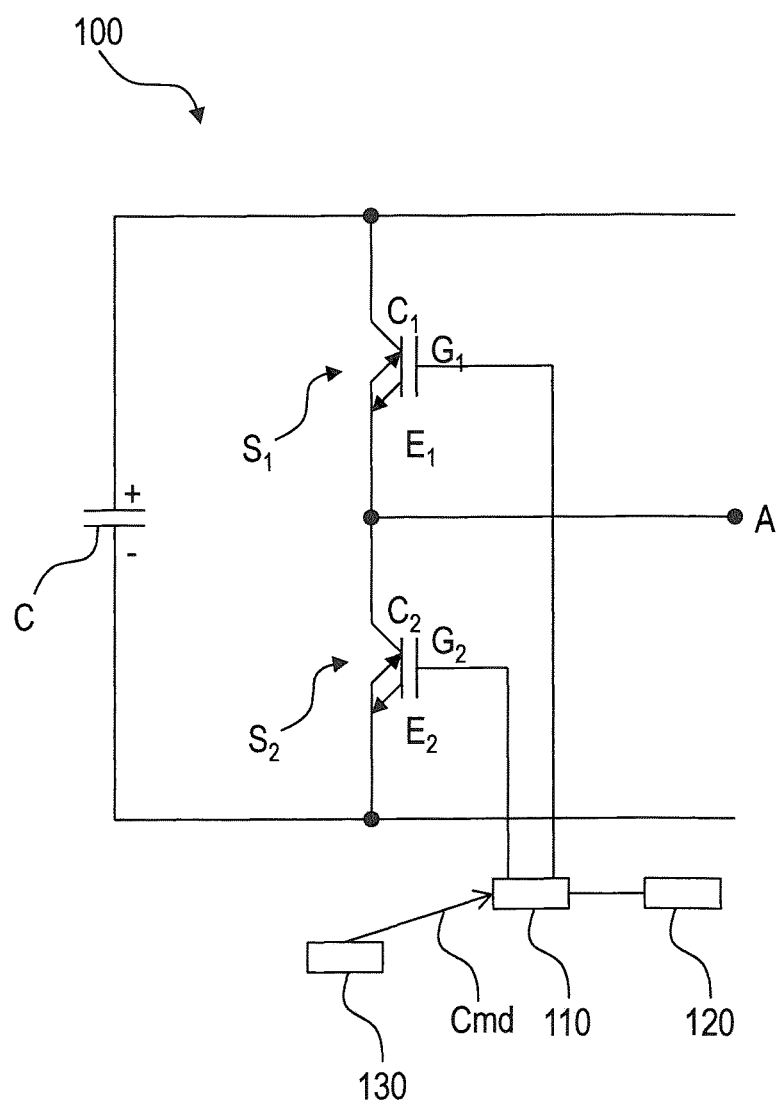
FIG. 1 is a schematic diagram illustrating two RC-IGBTs in half-bridge configuration.

With reference to FIG. 1, there will now be described a half-bridge circuit comprising two RC-IGBTs, here in the form of BIGTs.

FIG. 1 is a circuit diagram of a half bridge 100 in a voltage source converter, in which a first and a second RC-IGBT labelled $S_1$ and $S_2$ are arranged in series with a DC voltage source C, in this example in the form of an energy storage element such as a capacitor. An emitter $E_1$ of the first RC-IGBT $S_1$ is electrically connected to a collector $C_2$ of the second RC-IGBT $S_2$ at an AC terminal A. The first and second RC-IGBTs $S_1$, $S_2$ are adapted to receive a direct current from the DC voltage source and to supply an output current to a load (not shown) at the AC terminal A. In the context of the present disclosure, a positive output current corresponds to the forward direction of the first RC-IGBT $S_1$. Gate terminals $G_1$, $G_2$ of the respective RC-IGBTs $S_1$, $S_2$ are electrically connected to a controller 110 adapted to control the RC-IGBTs $S_1$, $S_2$ by supplying a gate voltage to their respective gates $G_1$, $G_2$. A current meter 120 is connected to the controller in order to provide the controller with information representing magnitude and direction of the output current. Furthermore, the collector $C_1$ of the first RC-IGBT $S_1$ is electrically connected to a positive pole of the DC voltage source C and the emitter $E_2$ is electrically connected to a negative pole of the DC voltage source C. When the half-bridge 100 is in operation in the voltage source converter, a higher level control unit 130 may provide the controller 110 with a command signal Cmd which indicates desired targeted turn-on and turn-off instants of the respective RC-IGBTs $S_1$, $S_2$. To ensure proper function of the half-bridge 100 and to avoid short-circuiting the DC voltage source C, only one of the RC-IGBTs $S_1$, $S_2$ should be turned-on at a time. Accordingly when the RC-IGBT $S_1$ is about to be turned-on the RC-IGBT $S_2$ should be turned off. The controller 110 interprets the command signal Cmd and applies gate voltage to the respective RC-IGBTs $S_1$, $S_2$ to control the RC-IGBTs in an appropriate manner according to different embodiments as will be described in further detail below.

Figure 2:
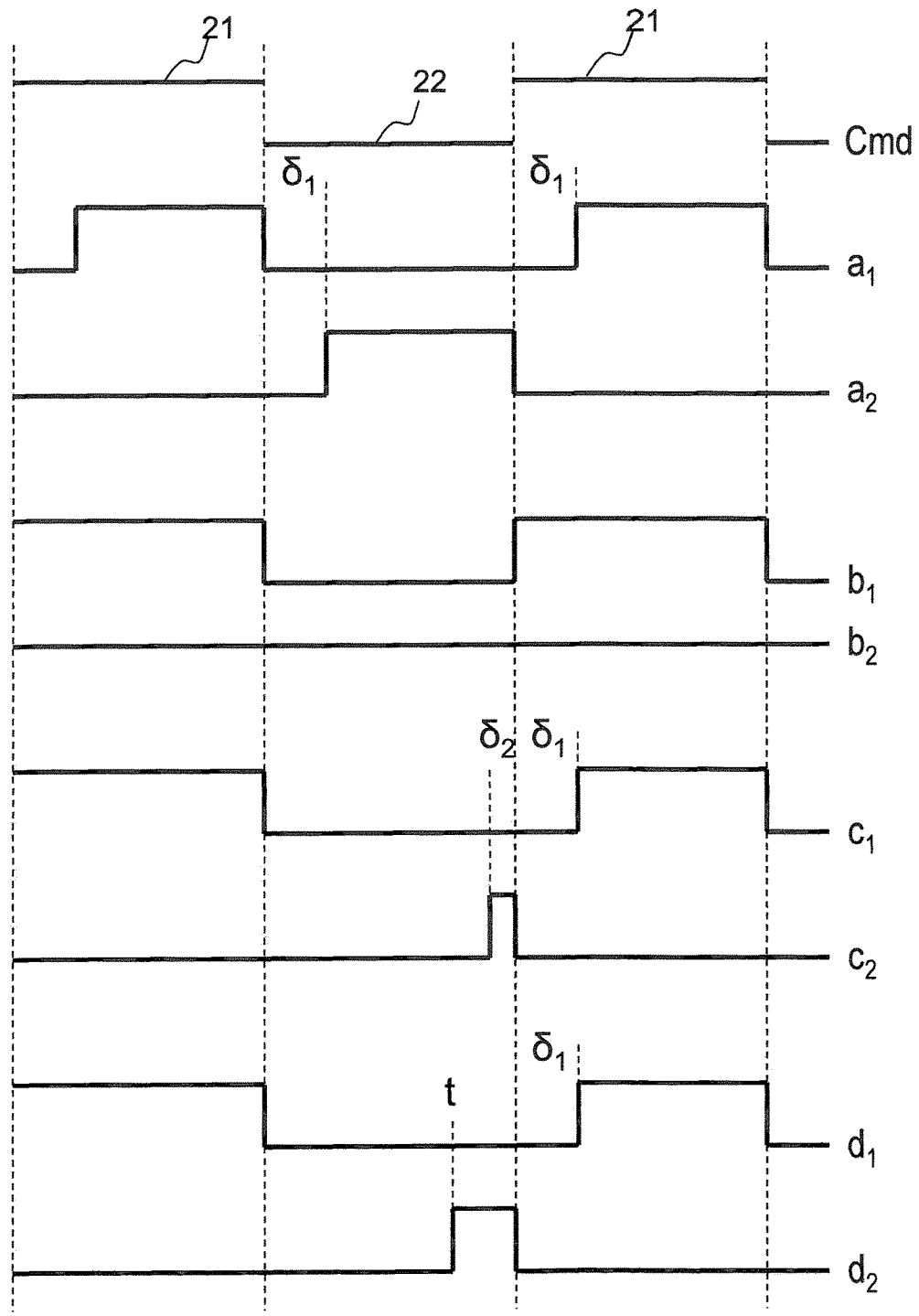
FIGS. 2 and 3 are schematic graphs illustrating respective gate signals over time applied to the first and second RC-IGBT according to different scenarios and embodiments.

FIG. 2 shows, as a function of time, the command signal Cmd provided to the controller 110 for controlling a first and a second RC-IGBT, such as the first and second RC-IGBTs $S_1$, $S_2$, illustrated in FIG. 1 according to an embodiment of the invention. As shown in FIG. 2, this example command signal Cmd starts at a first value 21 and then alternates between the first value 21 and a second value 22. Here the first value 21 indicates that the higher level control unit 130 desires a turn-on of the first RC-IGBT $S_1$ and a turn-off of the second RC-IGBT $S_2$ in the near future at a targeted instant that may depend on timing settings applied in the voltage source converter. Analogously the second value 22 indicates a desired turn-on of the second RC-IGBT $S_2$ and a desired turn-off of the first RC-IGBT $S_1$ in the near future. Respective gate voltages $a_1$-$g_1$; $a_2$-$g_2$ applied to the first and second RC-IGBT $S_1$, $S_2$ by the controller 110 in response to the command signal Cmd according to different embodiments and scenarios are also illustrated in FIG. 2. The gate voltage may be applied in two different levels—a high-level gate voltage corresponding to an ON state of the gate (i.e., the controlled RC-IGBT is able to conduct in the forward and the reverse direction), and a low-level gate voltage corresponding to an OFF state of the gate (i.e., the controlled RC-IGBT is able to conduct in the reverse direction only). The high-level gate voltage may correspond to a gate voltage exceeding a first component-specific threshold value above which the RC-IGBT is able to conduct in the forward direction. An episode or a plurality of consecutive episodes of high-level gate voltages may e.g. be realised by applying a gate voltage varying over time or a plurality of consecutive gate voltage values, wherein each value of the applied gate voltage exceeds the first component-specific threshold value and will be experienced as high-level by the RC-IGBT. Similarly, the low-level gate voltage may correspond to a gate voltage being below a second component-specific threshold value below which the RC-IGBT only conducts in its reverse direction. An episode or a plurality of consecutive episodes of low-level gate voltage may be realised by applying any gate voltage values being below the second component-specific threshold value. For illustrative purposes, the nominal high-level gate voltage for a 3000 V RC-IGBT may typically correspond to 15 V and the nominal low-level gate voltage to 0 V, even though all gate voltages above, e.g. 10 V may trigger an on-state of the gate of the RC-IGBT and all gate voltages below, e.g. 5 V may trigger an off-state of the gate of the RC-IGBT.

According to the different embodiments described below, the controller 110 controls the RC-IGBTs $S_1$, $S_2$ not only based on the command signal Cmd, but also based on a magnitude and a direction of the output current on the AC terminal A. The magnitude of the output current may provide an indication of when the direction of the output current is about to change. When the magnitude of the output current is small this indicates that the current direction is likely to change in the near future, while a higher output current indicates that the current direction is certainly not going to change in the near future. Therefore according to the embodiments described herein, the controller 110 uses information about the magnitude of the output current to control the RC-IGBTs as desired. Thus a non-zero current magnitude threshold may be selected to provide desired indication of whether or not the current direction is likely to change in the near future. The level of the current magnitude threshold may differ in different applications but may e.g. typically be set to 50-100 A in a typical HVDC voltage source converter. Instead of comparing the magnitude of the measured output current to a single current magnitude threshold, the measured output current may according to certain embodiments be compared to a positive threshold value and a negative threshold value, which values may have equal or different magnitude.

Now, returning to FIG. 2, the gate voltages $a_1$ and $a_2$ correspond to a scenario where an output current on the AC terminal A is below a positive threshold and exceeds a negative threshold, which have been selected to provide a desired indication of whether or not the current direction is likely to change in the near future as discussed above. For such an output current, the RC-IGBTs are controlled to turn-on and turn-off as indicated by the command signal Cmd by applying high-level gate voltage at targeted turn-on instants and by applying low-level gate voltage at targeted turn-off instants, here also using an appropriate blanking time $\delta_1$ between commutations to ensure that the DC voltage source C is not short-circuited. During the blanking time $\delta_1$ low-level gate voltage is applied to both RC-IGBTs such that neither one of the RC-IGBTs are turned on. Therefore the turn-on of the first RC-IGBT $S_1$ and the turn-on of the second RC-IGBT are separated by the blanking time $\delta_1$. Thus, in response to the first value 21 of the command signal Cmd, high-level gate voltage is applied to the first RC-IGBT $S_1$ and low-level voltage is applied to the second RC-IGBT $S_2$, and, in response to the second value 22 of the command signal Cmd, low-level gate voltage is applied to the first RC-IGBT $S_1$ and high-level gate voltage is applied to the second RC-IGBT $S_2$.

Still referring to FIG. 2, gate voltages $b_1$ and $b_2$ correspond to a scenario where the output current from the first and second RC-IGBTs exceeds the positive threshold. This scenario means that the first RC-IGBT $S_1$ is operated in the IGBT mode while the second RC-IGBT $S_2$ is in the diode mode. Therefore, the gate voltage $b_1$ applied to the first RC-IGBT $S_1$ alternates between high-level and low-level gate voltage in accordance with the alternation of the command signal Cmd. However, the gate voltage $b_2$ applied to the second RC-IGBT $S_2$ is maintained at the low level which allows for a reduction of conduction losses over the diode. A blanking time $\delta_1$ (not shown) may be applied prior to the gate voltage $b_1$ alternates back from the low-level voltage to the high-level voltage in response to the first value 21 of the command signal Cmd.

The gate voltages $c_1$ and $c_2$ also correspond to a scenario where the output current on the AC terminal A exceeds the positive threshold. The gate voltage $c_1$ applied to the first RC-IGBT $S_1$ alternates between high-level and low-level similarly to the gate voltage $b_1$. However, the gate voltage $c_2$ applied to the second RC-IGBT $S_2$ is a high-level voltage during a time period before turning on the first RC-IGBT $S_1$, i.e. also prior to a targeted turn-off instant of the second RC-IGBT $S_2$ as indicated by the command signal Cmd. The reason for applying high-level gate voltage to the second RC-IGBT $S_2$ prior to a targeted turn-off instant is to reduce the charge in the second RC-IGBT and hence switching losses. The high-level voltage as illustrated by the gate voltage $c_2$ is applied for a limited time period $\delta_2$, and is separated from the high-level of the gate voltage $c_1$ by the blanking time $\delta_1$.

Timing of the application of the high-level of the gate voltage $c_2$ may for example be realised by an agreed time delay between the point in time when the controller 110 receives the physical command signal Cmd and the actual targeted time instant when the controller is expected to effectuate a command indicated by the command signal by applying an appropriate gate voltage. The time delay, which is preferably longer than the time period $\delta_2$, may be used to accommodate a reaction time from when the physical command signal alternates from the second value 22 to the first value 21, so that the high-level voltage can be applied to the second RC-IGBT $S_2$ in time before the second RC-IGBT $S_2$ is targeted to turn off, that is, during a time period $\delta_2$ before the blanking time prior to turn on of the first RC-IGBT $S_1$, as specified by the alternation of the command signal Cmd, must be executed.

The gate voltages $d_1$ and $d_2$ illustrated in FIG. 2 correspond to a scenario in which the output current on the AC terminal A initially exceeds the positive threshold and then falls below the positive threshold but above the negative threshold, which is detected at a point of time t. Thus as, shown by the illustrated gate voltage $d_2$, high-level gate voltage is applied to the second RC-IGBT $S_2$ at time t, in response to the second value 22 of the command signal Cmd and the fact that the output current is below the positive threshold. The high-level gate voltage applied to the second RC-IGBT $S_2$ is maintained until the next targeted turn off of the second RC-IGBT S2 as indicated by the command signal Cmd, at which the gate voltage returns to the low level. The gate voltage $d_1$, which is applied to the first RC-IGBT, is similar to the gate voltage $a_1$ as described above, wherein the blanking time $\delta_1$ is introduced before the switching from the low level to the high level in response to the command signal alternating from the second value 22 back to the first value 21 to ensure that the two RC-IGBTs $S_1$ and $S_2$ are never turned on at the same time.

Figure 3:
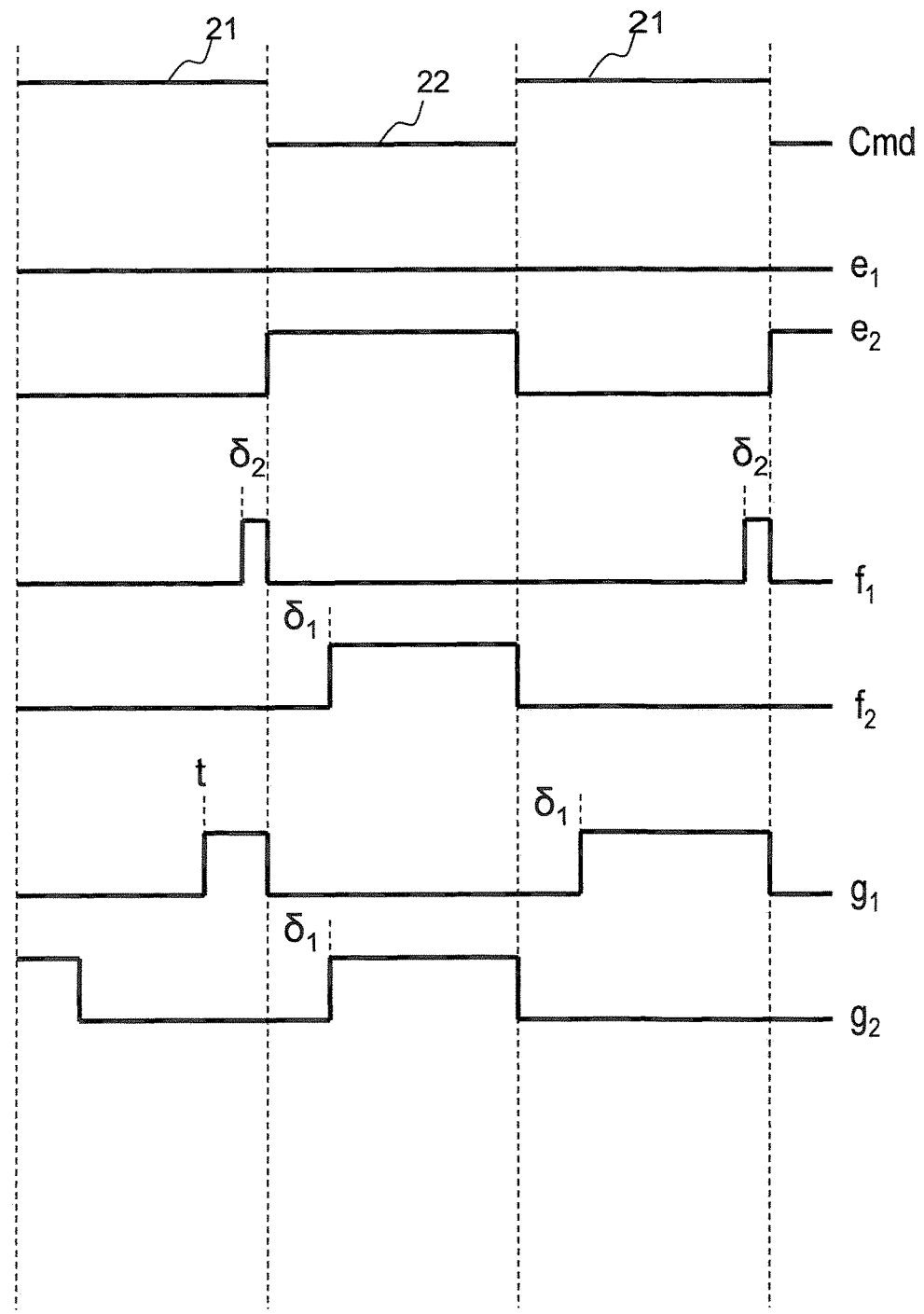

FIG. 3 shows a similar command signal Cmd as described above with reference to FIG. 2. Gate voltages $e_1$ and $e_2$ correspond to a scenario where the output current from AC terminal A is below the negative threshold. This scenario means that the first RC-IGBT $S_1$ is in the diode mode while the second RC-IGBT $S_2$ is in the IGBT mode. Therefore the gate voltage $e_1$ applied to the first RC-IGBT $S_1$ is maintained at the low level and the gate voltage $e_2$ alternates between a low level in response to the first value 21 of the command signal and a high level in response to the second value 22 of the command signal Cmd.

Illustrated gate voltages $f_1$ and $f_2$ also correspond to a scenario where the output current from AC terminal A is below the negative threshold. However as illustrated by the gate voltage $f_1$, high-level gate voltage is applied to the first RC-IGBT $S_1$ during a time period $\delta_2$ before a targeted turn off of the first RC-IGBT $S_1$ as indicated by the command signal Cmd alternating from the first value 21 to the second value 22. The gate control of the first RC-IGBT $S_1$ illustrated by the gate voltage $f_1$ corresponds to the gate control of the second RC-IGBT $S_2$ illustrated by the gate voltage $c_2$. The gate voltage $f_2$ applied to the second RC-IGBT $S_2$, which is in the IGBT mode, alternates in accordance with what is described with reference to the gate voltage $e_2$. However, as illustrated in this example a blanking time $\delta_1$ may be applied between application of the high-level gate voltage to the first RC-IGBT $S_1$ and the application of the high-level gate voltage to the second RC-IGBT $S_2$.

Illustrated gate voltages $g_1$ and $g_2$ correspond to a scenario in which the output current initially is below the negative threshold and then rises above the negative threshold but below the positive threshold as detected at a point of time t. Thus, as shown by the illustrated gate voltage $g_1$, high-level gate voltage is applied to the first RC-IGBT $S_1$ at time t in response to the first value 21 of the command signal Cmd and the fact that the output current exceeds the negative threshold and is below the positive threshold. The gate voltage $g_2$ applied to the second RC-IGBT $S_2$ corresponds to the gate voltage $a_1$ as described above. As illustrated the blanking time $\delta_1$ separates application of high-level gate voltages to the respective RC-IGBTs $S_1$, $S_2$.

Figure 4:
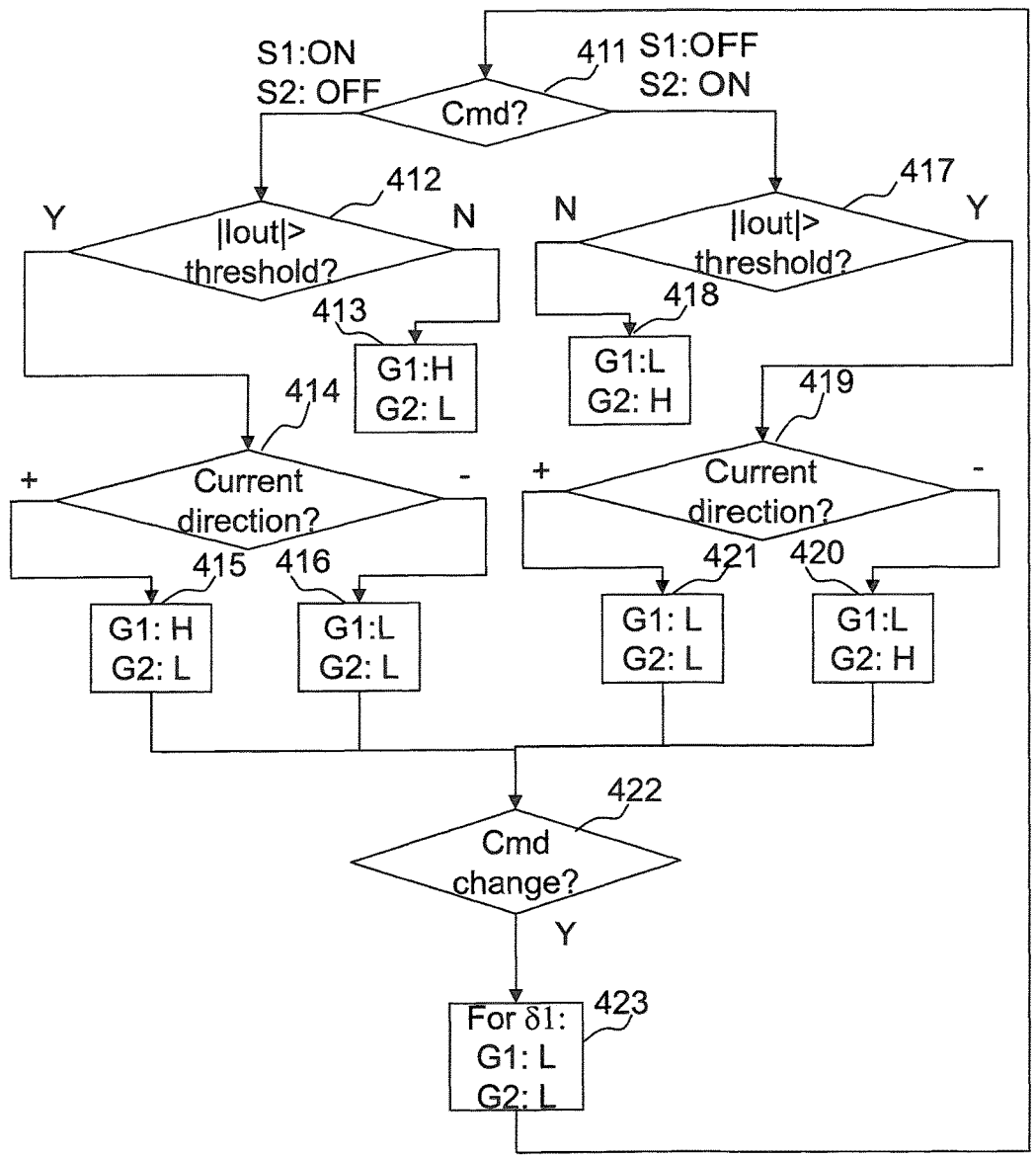
FIG. 4 is a flowchart of a control method according to an embodiment of the invention.

Finally, FIG. 4 is a flowchart illustrating a control algorithm for controlling the RC-IGBTs of FIG. 1 in accordance with an embodiment of the invention. The control algorithm may be performed by the controller 110. At a step 411 the state of the command signal is examined. In this example it is assumed that the command signal alternates between the first value 21 and the second value 22 as described above in connection with FIG. 2. If the command signal has the first value 21, signalling an imminent targeted turn-on of the first RC-IGBT and turn-off of the second RC-IGBT, the algorithm proceeds to a step 412 in which the magnitude of the output current on the AC terminal A is compared to the selected current magnitude threshold. If the magnitude of the output current does not exceed the current magnitude threshold, then, in a step 413, gate voltages are applied to the respective gates of the first and the second RC-IGBT to control the RC-IGBTs in accordance with the targeted states indicated by the command signal, i.e. high-level gate voltage is applied to the gate of the first RC-IGBT and low-level gate voltage is applied to the second RC-IGBT. However, if it is detected in the step 412 that the magnitude of the output current exceeds the current magnitude threshold, then in a step 414, the direction of the output current is checked. Here a positive current corresponds to the forward direction of the first RC-IGBT. If the output current is positive the first RC-IGBT is operated in IGBT mode and controlled in accordance with the command signal as indicated by a step 415, i.e. a high-level gate voltage is applied to the first RC-IGBT and a low-level gate voltage is applied to the second RC-IGBT. If on the other hand the output current is negative, this indicates that the first RC-IGBT is operated in diode mode and normal application of gate voltages to the first RC-IGBT in accordance with the command signal may be omitted as explained above in order to reduce switching losses. Thus, as indicated in a step 416 a low-level gate voltage is applied to both the first and the second RC-IGBT if the output current is detected to be negative in the step 414. The opposite operation is performed if the command signal is detected to have the second value 22 in the step 411, since the second value 22 signals a subsequent targeted turn-off of the first RC-IGBT and turn-on of the second RC-IGBT. The algorithm then proceeds to a step 417 in which the magnitude of the output current on the AC terminal A is compared to the selected current magnitude threshold. If the magnitude of the output current does not exceed the current magnitude threshold, then, in a step 418, gate voltages are applied to the respective gates of the first and the second RC-IGBT to control the RC-IGBTs in accordance with the targeted states indicated by the command signal, i.e. low-level gate voltage is applied to the gate of the first RC-IGBT and high-level gate voltage is applied to the second RC-IGBT. However, if it is detected in the step 417 that the magnitude of the output current exceeds the current magnitude threshold, then in a step 419, the direction of the output current is checked. If the output current is negative the second RC-IGBT is operated in IGBT mode and controlled in accordance with the command signal, as indicated by a step 420 according to which a low-level gate voltage is applied to the first RC-IGBT and a high-level gate voltage is applied to the second RC-IGBT. If on the other hand the output current is positive, this indicates that the second RC-IGBT is operated in diode mode and normal application of high-level gate voltage to the second RC-IGBT in accordance with the command signal may be omitted as explained above in order to reduce switching losses. Thus, as indicated in a step 421 a low-level gate voltage is applied to both the first and the second RC-IGBT if the output current is detected to be positive in the step 419. If a change in the state of the command signal is detected in a step 422, the algorithm may again return to the step 411. Optionally, prior to returning to the step 411, a step 423 may be performed according to which low-level gate voltage is applied to both RC-IGBTs during a selected time period $\delta_1$ to implement a blanking time that ensures that both RC-IGBTs will not be turned-on simultaneously. I shall be understood that according to other embodiments the algorithm illustrated in FIG. 4 may be amended to implement the high-level gate pulses during the time period $\delta_2$ as illustrated for gate voltages $c_2$ and $f_1$ in FIGS. 2 and 3 to further reduce the switching losses.

As outlined above, the control algorithm illustrated by FIG. 4 may be embodied as computer-executable instructions distributed and used in the form of a computer-program product including a computer readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media typically embodies computer readable instructions, data structures, program modules or other data in a modulated data signal such as a carrier wave or other transport mechanism and includes any information delivery media.

The invention claimed is:

1. A method of controlling a first and a second reverse-conducting insulated gate bipolar transistor, RC-IGBT, electrically connected in series, wherein:
   a collector of the first RC-IGBT is electrically connected to a positive pole of a direct current, DC, voltage source and an emitter of the second RC-IGBT is electrically connected to a negative pole of the DC voltage source; and
   an emitter of the first RC-IGBT is electrically connected to a collector of the second RC-IGBT to form an alternating current, AC, terminal,
   the method comprising the steps of:
   comparing a magnitude of an output current on the AC terminal with a selected threshold; and
   applying a gate voltage to respective gates of the first and second RC-IGBTs,
   wherein said gate voltage is controlled based on a direction of the output current on the AC terminal, the comparison of the magnitude of the output current on the AC terminal with the selected threshold and on a command signal indicating targeted turn-on and turn-off instants for the respective RC-IGBTs, and wherein, if said comparison indicates that the magnitude of the output current on the AC terminal exceeds the selected threshold and the direction of the output current indicates that one of the RC-IGBTs is operated in IGBT mode and the other RC-IGBT is operated in diode mode, high-level and low-level gate voltage pulses are applied respectively to the RC-IGBT operated in IGBT mode during respective targeted turn-on and turn-off instants as indicated by the command signal, and
   wherein the method further comprises: if said comparison indicates that the magnitude of the output current on the AC terminal exceeds the selected threshold and the direction of the output current indicates that one of the RC-IGBTs is operated in IGBT mode and the other RC-IGBT is operated in diode mode, applying and maintaining a low level gate voltage to the other RC-IGBT except during a time period prior to a targeted turn-off instant for the other RC-IGBT indicated by the command signal, during which time duration a high-level gate voltage pulse is applied to the other RC-IGBT.

2. The method according to claim 1, further comprising:
   if said comparison indicates that the magnitude of the output current on the AC terminal does not exceed the selected threshold,
   applying high-level and low-level gate voltage pulses respectively to both RC-IGBTs during respective targeted turn-on and turn-off instants for the respective RC-IGBTs as indicated by the command signal.

3. The method according to claim 2, wherein gate voltages are applied to the first and second RC-IGBTs such that application of the high level gate voltage to one of said RC-IGBTs and application of the high level gate voltage to the other RC-IGBT is separated by a blanking time during which blanking time the low level gate voltage is applied to both of said RC-IGBTs.

4. The method according to claim 1, wherein gate voltages are applied to the first and second RC-IGBTs such that application of the high level gate voltage to one of said RC-IGBTs and application of the high level gate voltage to the other RC-IGBT is separated by a blanking time during which blanking time the low level gate voltage is applied to both of said RC-IGBTs.

5. The method according to claim 1, further comprising:
   if said comparison indicates that the magnitude of the output current on the AC terminal does not exceed the selected threshold,
   applying high-level and low-level gate voltage pulses respectively to both RC-IGBTs during respective targeted turn-on and turn-off instants for the respective RC-IGBTs as indicated by the command signal.

6. The method according to claim 1, wherein gate voltages are applied to the first and second RC-IGBTs such that application of the high level gate voltage to one of said RC-IGBTs and application of the high level gate voltage to the other RC-IGBT is separated by a blanking time during which blanking time the low level gate voltage is applied to both of said RC-IGBTs.

7. The method according to claim 1, wherein the DC voltage source is an energy storage element.

8. The method according to claim 1, wherein the first and the second RC-IGBTs are in half bridge configuration, or are included in a full bridge configuration, and electrically connected to a storage element.

9. The method according to claim 1, wherein the first and the second RC-IGBTs are included in a cell of a branch of cascade connected cells and wherein a measurement of the output current on the AC terminal is obtained by measuring the current through the branch.

10. The method according to claim 1, wherein each of the first and second RC-IGBTs is a bi-mode insulated gate transistor (BIGT).

11. The method according to claim 1, wherein the command signal is complementary for the first RC-IGBT and the second RC-IGBT.

12. A computer program product comprising a non-transitory data carrier with computer executing computer readable instructions for causing a programmable processing unit, connected to a first and a second RC-IGBT, to perform the method according to claim 1 to control both the first RC-IGBT and the second RC-IGBT, wherein:
   the first and second RC-IGBTs are electrically connected in series;
   a collector of the first RC-IGBT is electrically connected to a positive pole of a direct current voltage source and an emitter of the second RC-IGBT is electrically connected to a negative pole of the DC voltage source; and an emitter of the first RC-IGBT is electrically connected to a collector of the second RC-IGBT at an alternating current terminal.

13. A controller for controlling a first and a second reverse-conducting insulated gate bipolar transistor, RC-IGBT, electrically connected in series, wherein:
a collector of the first RC-IGBT is electrically connected to a positive pole of a direct current voltage source and an emitter of the second RC-IGBT is electrically connected to a negative pole of the DC voltage source;
an emitter of the first RC-IGBT is electrically connected to a collector of the second RC-IGBT to form an alternating current terminal; and
the controller comprising:
an input circuit adapted to receive a command signal indicating targeted turn-on and turn-off instants for the respective RC-IGBTs;
a processor, adapted to:
receive information from a current meter on a magnitude and direction of a measured output current on said AC terminal;
compare the magnitude of the measured output current on the AC terminal with a selected threshold; and
determine, based on the received command signal, the received information on the direction of the measured output current and the comparison of the magnitude of the measured output current on the AC terminal with the selected threshold, a gate voltage for application to respective gates of the first and second RC-IGBTs; and
an output circuit connected to respective gates of the first and second RC-IGBT,
wherein the output circuit is further adapted to apply a determined gate voltage to respective gates of the first and second RC-IGBTs, wherein the controller is configured to, if said comparison indicates that the magnitude of the output current on the AC terminal exceeds the selected threshold and received information on the direction of the output current indicates that one of the RC-IGBTs is operated in IGBT mode and the other RC-IGBT is operated in diode mode, apply high-level and low-level gate voltage pulses respectively to the RC-IGBT operated in IGBT mode during respective targeted turn-on and turn-off instants as indicated by the command signal,
wherein the controller is further configured to, if said comparison indicates that the magnitude of the output current on the AC terminal exceeds the selected threshold and received information on the direction of the output current indicates that one of the RC-IGBTs is operated in IGBT mode and the other RC-IGBT is operated in diode mode, apply and maintain a low level gate voltage to the other RC-IGBT except during a time period prior to a targeted turn-off instant for the other RC-IGBT indicated by the command signal, during which time duration a high-level gate voltage pulse is applied to the other RC-IGBT.

14. The controller according to claim 13, wherein the controller is configured to, if said comparison indicates that the magnitude of the output current on the AC terminal does not exceed the selected threshold,
apply high-level and low-level gate voltage pulses respectively to both RC-IGBTs during respective targeted turn-on and turn-off instants for the respective RC-IGBTs as indicated by the command signal.

15. The controller according to claim 13, wherein the first and second RC-IGBTs are bi-mode insulated gate transistors (BIGTs).

16. The controller according to claim 13, wherein the command signal is complementary for the first RC-IGBT and the second RC-IGBT.

17. The controller according to claim 13, wherein the controller is embodied by a computer executing computer readable instructions to control both the first RC-IGBT and the second RC-IGBT.

18. A voltage source converter for converting between AC and DC current, comprising:
an arrangement of connected RC-IGBTs comprising at least a first and a second RC-IGBT electrically connected in series, wherein:
a collector of the first RC-IGBT is electrically connected to a positive pole of a direct current voltage source and an emitter of the second RC-IGBT is electrically connected to a negative pole of the DC voltage source; and
an emitter of the first RC-IGBT is electrically connected to a collector of the second RC-IGBT at an alternating current terminal; and
the controller according to claim 13 which is electrically connected to the arrangement of RC-IGBTs.

* * * * *